United States Patent
Lin

(10) Patent No.: US 9,431,271 B2
(45) Date of Patent: Aug. 30, 2016

(54) HEAT DISSIPATING DEVICE

(75) Inventor: Chia-Yu Lin, New Taipei (TW)

(73) Assignee: COOLER MASTER DEVELOPMENT CORPORATION, New Taipei (TW)

( * ) Notice: Subject to any disclaimer, the term of this patent is extended or adjusted under 35 U.S.C. 154(b) by 906 days.

(21) Appl. No.: 13/426,598

(22) Filed: Mar. 22, 2012

(65) Prior Publication Data

US 2013/0153192 A1    Jun. 20, 2013

Related U.S. Application Data

(63) Continuation-in-part of application No. 13/329,313, filed on Dec. 18, 2011, now abandoned.

(30) Foreign Application Priority Data

Jan. 20, 2012    (TW) .............................. 101201652 U

(51) Int. Cl.
| | | |
|---|---|---|
| F28F 7/00 | (2006.01) | |
| H01L 21/48 | (2006.01) | |
| H01L 23/367 | (2006.01) | |

(52) U.S. Cl.
CPC ....... *H01L 21/4882* (2013.01); *H01L 23/3672* (2013.01); *H01L 23/3677* (2013.01); *H01L 2924/0002* (2013.01)

(58) Field of Classification Search
CPC .......... H01L 23/3672; H01L 23/3675; H01L 23/367; H01L 21/4882; H01L 23/3677; H05K 7/20409; B21D 53/02; B22D 19/0063; F28F 3/02; F28F 3/06; F28F 2275/14
USPC .......................................... 361/703; D13/179
See application file for complete search history.

(56) References Cited

U.S. PATENT DOCUMENTS

| | | | | |
|---|---|---|---|---|
| 5,542,176 | A * | 8/1996 | Serizawa | B21C 37/225 165/185 |
| 5,819,407 | A * | 10/1998 | Terada | 29/890.03 |
| 6,180,436 | B1 * | 1/2001 | Koors et al. | 438/117 |
| 6,212,073 | B1 * | 4/2001 | Yamaguchi | 361/705 |
| 6,237,222 | B1 * | 5/2001 | Chen | B23P 15/26 257/E23.103 |
| 8,966,758 | B1 * | 3/2015 | McReynolds | F28F 3/083 165/80.2 |
| 2002/0179287 | A1 * | 12/2002 | Graf et al. | 165/80.3 |
| 2005/0012202 | A1 * | 1/2005 | Bock | H01L 21/4882 257/706 |
| 2005/0199368 | A1 * | 9/2005 | Gonzales | F28F 3/02 165/80.3 |
| 2007/0074850 | A1 * | 4/2007 | Peschl | 165/80.3 |
| 2007/0102147 | A1 * | 5/2007 | Chang | 165/185 |

\* cited by examiner

*Primary Examiner* — Allen Flanigan
*Assistant Examiner* — Jason Thompson
(74) *Attorney, Agent, or Firm* — WPAT, PC; Justin King

(57) ABSTRACT

A heat dissipating device includes a base and a plurality of heat dissipating fins. The base includes a substrate and a box, wherein the substrate and the box are formed integrally and the box has an accommodating space therein. Each of the heat dissipating fins includes a heat dissipating portion, a fixing portion and an overflow-proof structure. The fixing portion is fixed in the base. The overflow-proof structure is connected between the heat dissipating portion and the fixing portion. A width of the overflow-proof structure is larger than a width of the heat dissipating portion and larger than a width of the fixing portion.

1 Claim, 16 Drawing Sheets

HEAT DISSIPATING DEVICE

CROSS REFERENCE TO RELATED APPLICATIONS

This is a Continuation in Part application of Ser. No. 13/329,313, now pending, filed on Dec. 18, 2011.

BACKGROUND OF THE INVENTION

1. Field of the Invention

The invention relates to a heat dissipating device and, more particularly, to a heat dissipating device adapted for being used outside. Furthermore, the heat dissipating device has a heat dissipating fin capable of preventing overflow during manufacturing process.

2. Description of the Prior Art

Heat dissipating device is a significant component for electronic products. When an electronic product is operating, the current in circuit will generate unnecessary heat due to impedance. If the heat is accumulated in the electronic components of the electronic product without dissipating immediately, the electronic components may get damage due to the accumulated heat. Therefore, the performance of heat dissipating device is a significant issue for the electronic product.

Referring to FIGS. 1 and 2, FIG. 1 is a schematic diagram illustrating a flat-type heat dissipating fin 12 of the prior art, and FIG. 2 is a schematic diagram illustrating a cylinder-type heat dissipating fin 22 of the prior art. In general, a heat dissipating device is usually equipped with a flat-type heat dissipating fin 12 shown in FIG. 1 or a cylinder-type heat dissipating fin 22 shown in FIG. 2. As shown in FIGS. 1 and 2, the flat-type heat dissipating fin 12 and the cylinder-type heat dissipating fin 22 are formed with the bases 10, 20 integrally by a die casting process. Due to the requirement of mold stripping during the die casting process, the flat-type heat dissipating fin 12 or the cylinder-type heat dissipating fin 22 has a draft angle $\alpha$ between 2 degrees and 3 degrees so that the whole weight is heavy and the height of the fin is limited. Furthermore, the number of heat dissipating fins is reduced in the heat dissipating device due to the draft angle $\alpha$ so that the heat dissipating area is not enough and the heat dissipating efficiency is worse.

Furthermore, since the conventional bases 10, 20 are formed as flat plates, once a heat dissipating device is attached on an outdoor electronic device with the bases 10, 20, the electronic device will be exposed out of the periphery of the bases 10, 20. Consequently, the electronic device will be battered and damaged by wind and rain.

SUMMARY OF THE INVENTION

The invention provides a heat dissipating device with a box capable of accommodating electronic device(s) such that the heat dissipating device can be used outside.

The invention further provides a heat dissipating device with a heat dissipating fin capable of preventing overflow during manufacturing process. The heat dissipating fin is formed by a forming process without the draft angle of the conventional heat dissipating fin As mentioned in the above, when the heat dissipating device of the invention is installed outside, electronic device(s) can be accommodated in an accommodating space within the box of the base so as to protect the electronic device(s) from being battered and damaged by wind and rain. Furthermore, the invention may form the heat dissipating fin by a forming process (e.g. aluminum extrusion process, rivet forming process, etc.) first and then form the base, which covers the fixing portion of the heat dissipating fin, by a die casting process with melt metal material. The heat dissipating fin of the invention has the overflow-proof structure capable of preventing the melt metal material from overflowing during the die casting process so as to prevent deckle edge from being generated. Since the heat dissipating fin of the invention is formed by the forming process, the draft angle of the conventional heat dissipating fin is unnecessary for the heat dissipating fin of the invention. Therefore, the whole weight of the heat dissipating fin of the invention can be lighter and the height of the heat dissipating fin of the invention can be higher than the prior art. Furthermore, the number of heat dissipating fins of the invention can be increased in the heat dissipating device so that the heat dissipating area can be increased and the heat dissipating efficiency can be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
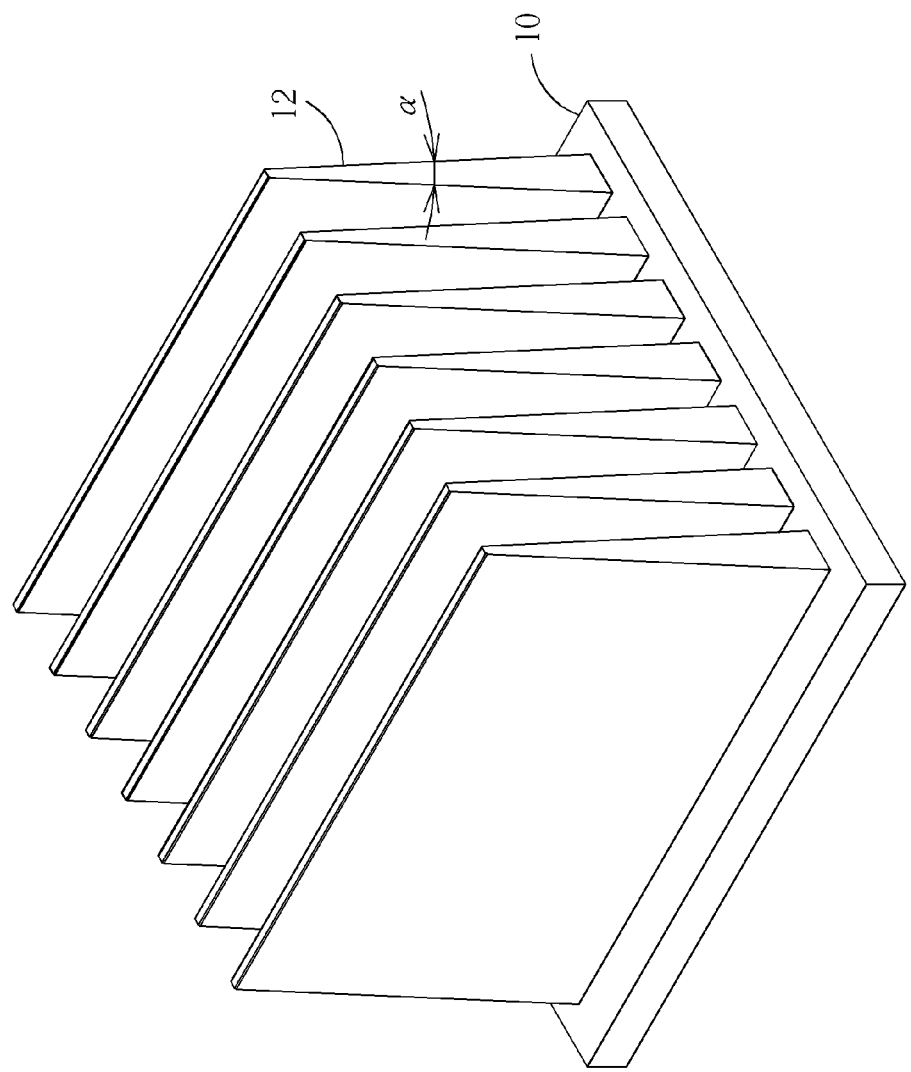
FIG. 1 is a schematic diagram illustrating a flat-type heat dissipating fin of the prior art.
Figure 2:
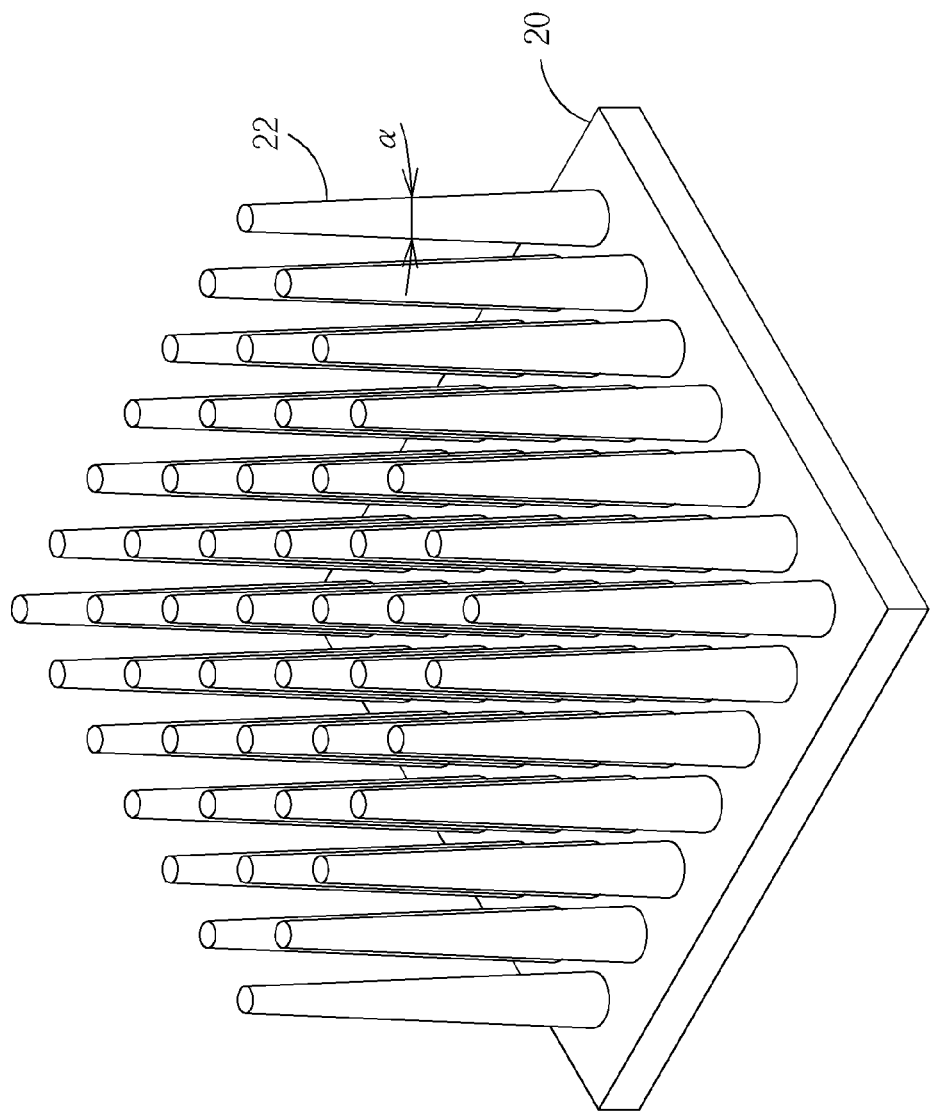
FIG. 2 is a schematic diagram illustrating a cylinder-type heat dissipating fin of the prior art.
Figure 3:
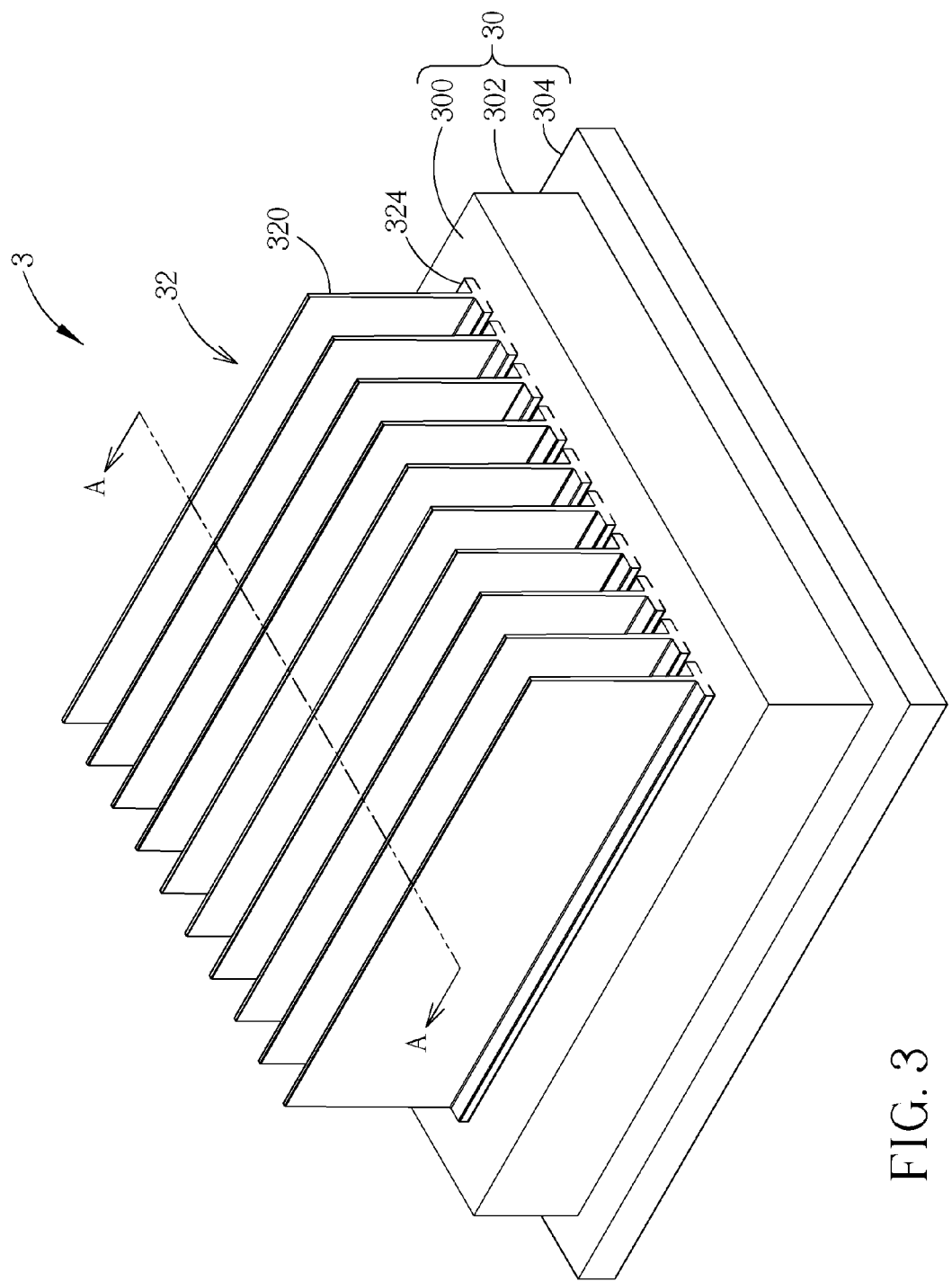
FIG. 3 is a schematic diagram illustrating a heat dissipating device according to a first embodiment of the invention.
Figure 4:
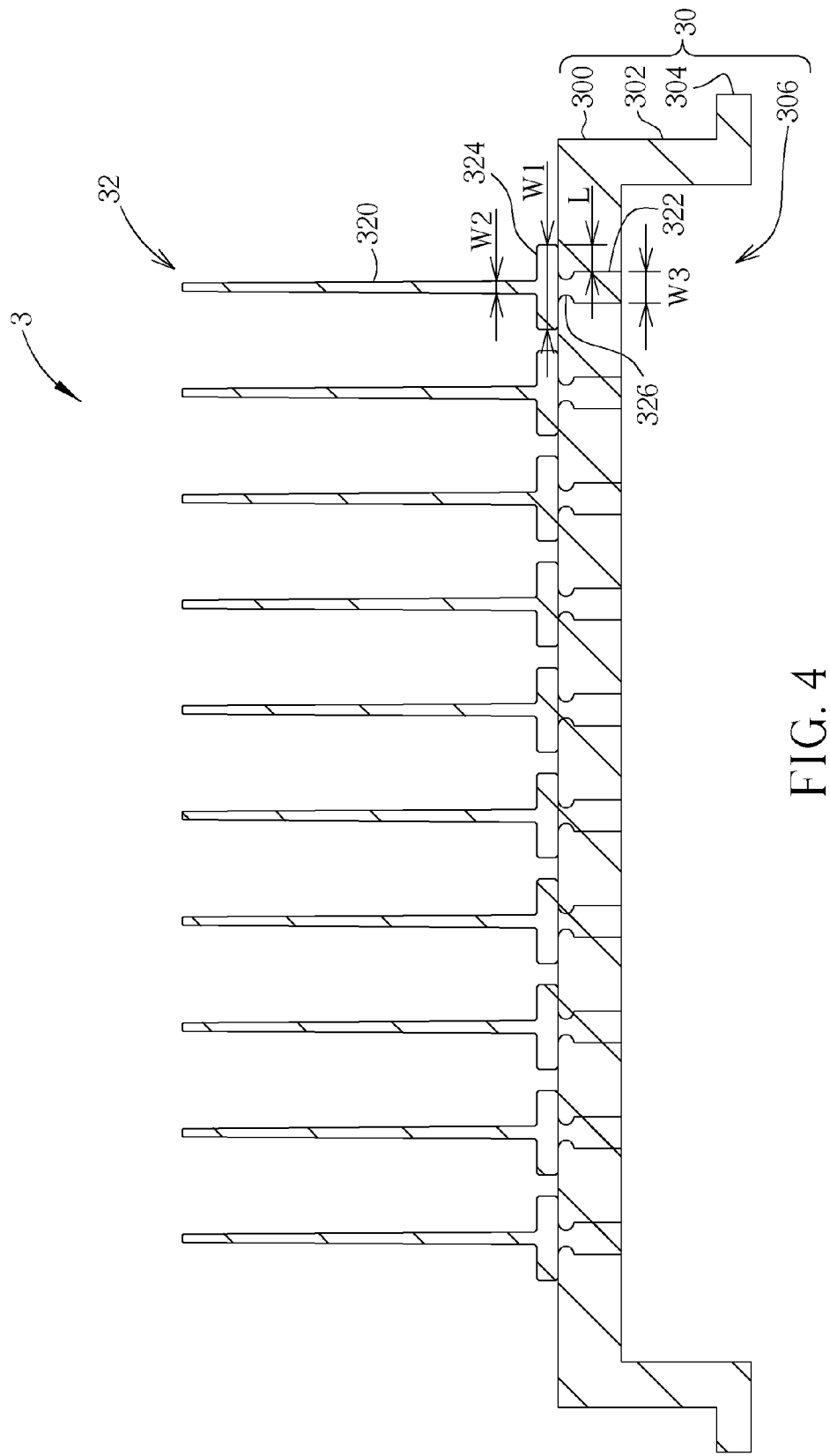
FIG. 4 is a cross-sectional view illustrating the heat dissipating device along line A-A shown in FIG. 3.
Figure 5:
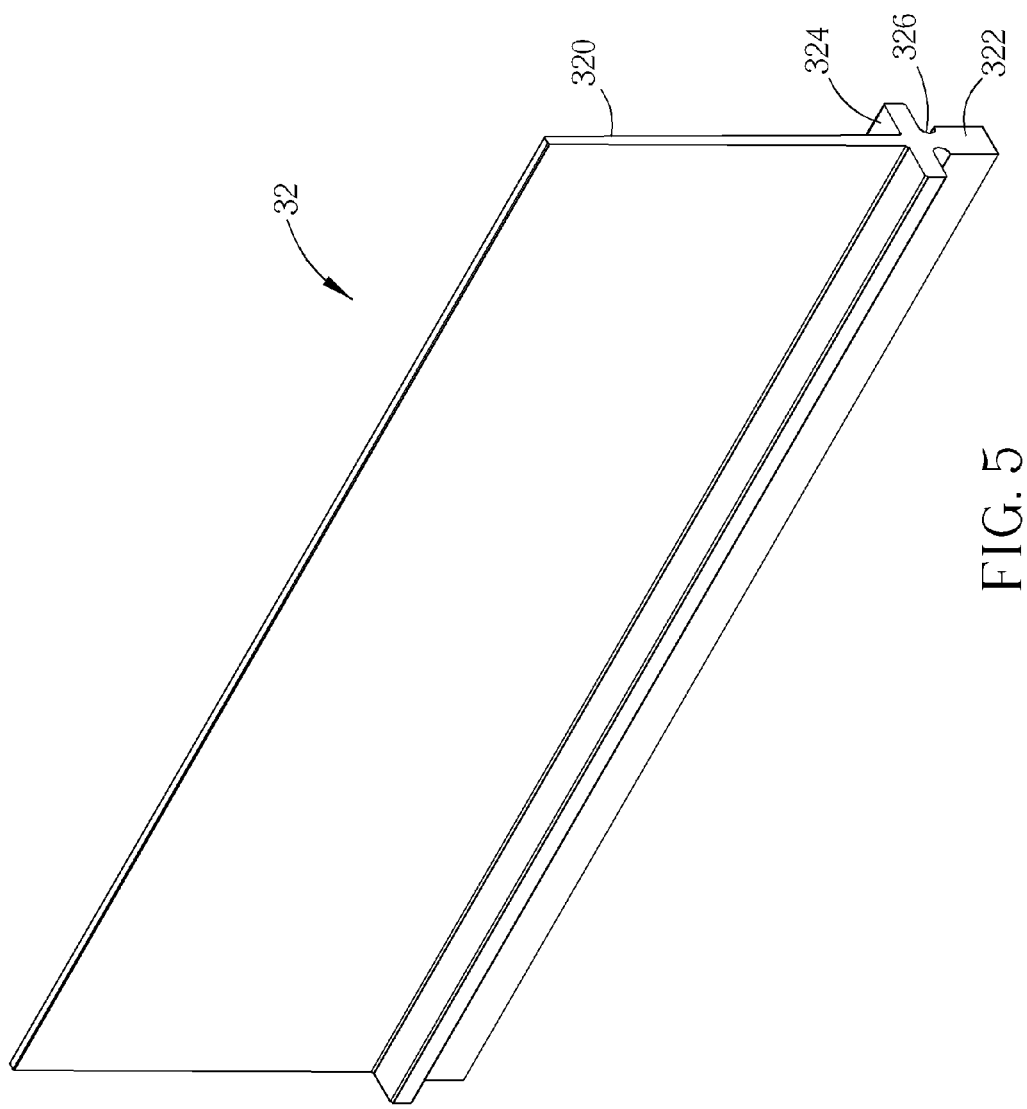
FIG. 5 is a schematic diagram illustrating the heat dissipating fin shown in FIG. 3.

Referring to FIGS. 3 to 5, FIG. 3 is a schematic diagram illustrating a heat dissipating device 3 according to a first embodiment of the invention, FIG. 4 is a cross-sectional view illustrating the heat dissipating device 3 along line A-A shown in FIG. 3, and FIG. 5 is a schematic diagram illustrating the heat dissipating fin 32 shown in FIG. 3. As shown in FIGS. 3 and 4, the heat dissipating device 3 comprises a base 30 and a plurality of heat dissipating fins 32. The base 30 comprises a substrate 300, a box 302 and a flange 304, wherein the substrate 300 and the box 302 are formed integrally, the box 302 has an accommodating space 306 therein, and the flange 304 protrudes from a periphery of the box 302. In practical applications, the flange 304 may be fixed on a plane by screw, rivet, soldering or other fixing manners so as to fix the heat dissipating device 3 on the plane. When the heat dissipating device 3 of the invention is installed outside (e.g. outdoor base station), electronic device(s) can be accommodated in the accommodating space 306 within the box 302 of the base 30 so as to protect the electronic device(s) from being battered and damaged by wind and rain.

As shown in FIGS. 4 and 5, each of the heat dissipating fins 32 comprises a heat dissipating portion 320, a fixing portion 322 which has a bottom surface that is flush with a bottom surface of the substrate as clearly depicted and an overflow-proof structure 324 which includes first and second portions that extend traversely with respect to the fin and are spaced apart from neighboring overflow-proof structures as clearly depicted. The fixing portion 322 is fixed in the base 30. The overflow-proof structure 324 is connected between the heat dissipating portion 320 and the fixing portion 322. A width W1 of the overflow-proof structure 324 is larger than a width W2 of the heat dissipating portion 320 and larger than a width W3 of the fixing portion 322. In this embodiment, a length L of the overflow-proof structure 324 protruded from the fixing portion 322 can be between 1 mm and 10 mm, wherein a thickness of the overflow-proof structure 324 is uniform. In another embodiment, a thickness of the overflow-proof structure 324 may vary gradiently.

Furthermore, each of the heat dissipating fins 32 may further comprise a recess structure 326 formed on the fixing portion 322. In this embodiment, the recess structure 326 is arc-shaped. In another embodiment, the recess structure 326 may be polygon-shaped.

Figure 6:
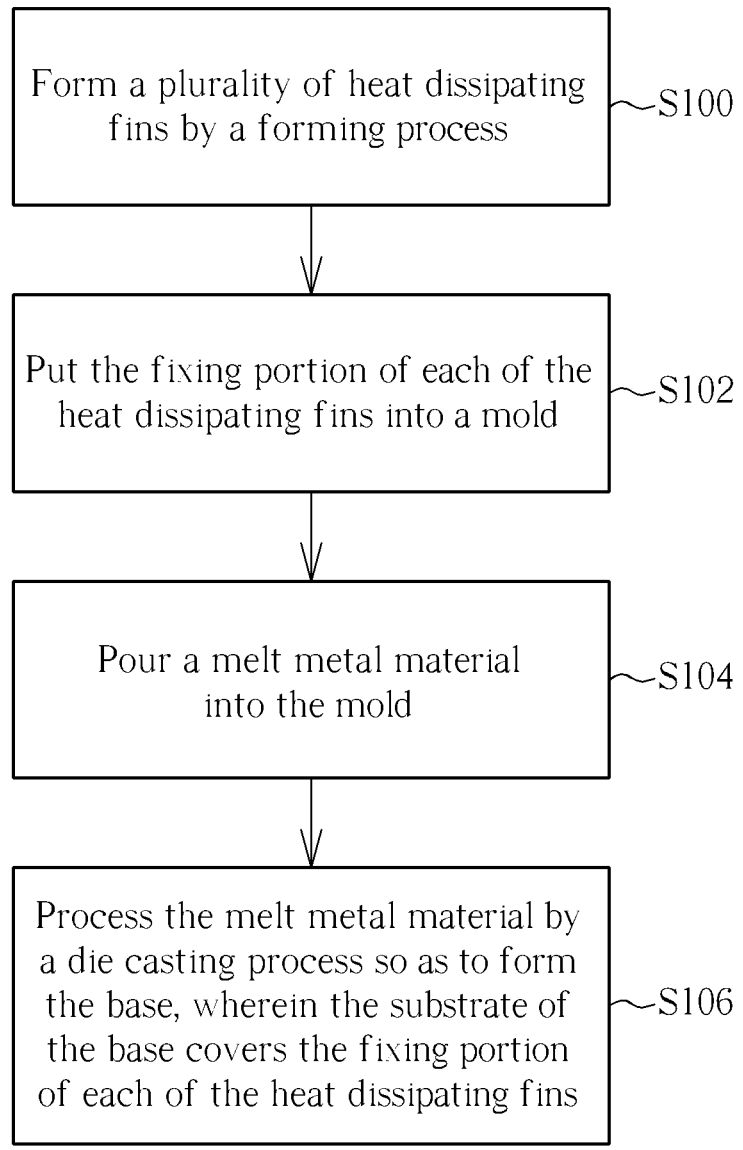
FIG. 6 is a flowchart illustrating a method of manufacturing the heat dissipating device shown in FIG. 3.

Referring to FIG. 6, FIG. 6 is a flowchart illustrating a method of manufacturing the heat dissipating device 3 shown in FIG. 3. First of all, step S100 is performed to form a plurality of heat dissipating fins 32 by a forming process. In this embodiment, the aforesaid forming process may be an aluminum extrusion process so as to form each of the heat dissipating fins 32 as a flat-type heat dissipating fin. Afterward, step S102 is performed to put the fixing portion 322 of each of the heat dissipating fins 32 into a mold (not shown). Step S104 is then performed to pour a melt metal material (e.g. aluminum, etc.) into the mold. Finally, step S106 is performed to process the melt metal material by a die casting process so as to form the base 30, wherein the substrate 300 of the base 30 covers the fixing portion 322 of each of the heat dissipating fins 32, as shown in FIG. 4. In this embodiment, the overflow-proof structure 324 of each of the heat dissipating fins 32 is capable of preventing the melt metal material from overflowing during the die casting process so as to prevent deckle edge from being generated. When the length L of the overflow-proof structure 324 protruded from the fixing portion 322 is between 1 mm and 10 mm, the overflow-proof structure 324 can prevent the melt metal material from overflowing during the die casting process effectively so as to prevent deckle edge from being generated. Furthermore, the recess structure 326 of each of the heat dissipating fins 32 can hold the metal material effectively so as to enhance the combination strength between the base 30 and the heat dissipating fins 32.

Figure 7:
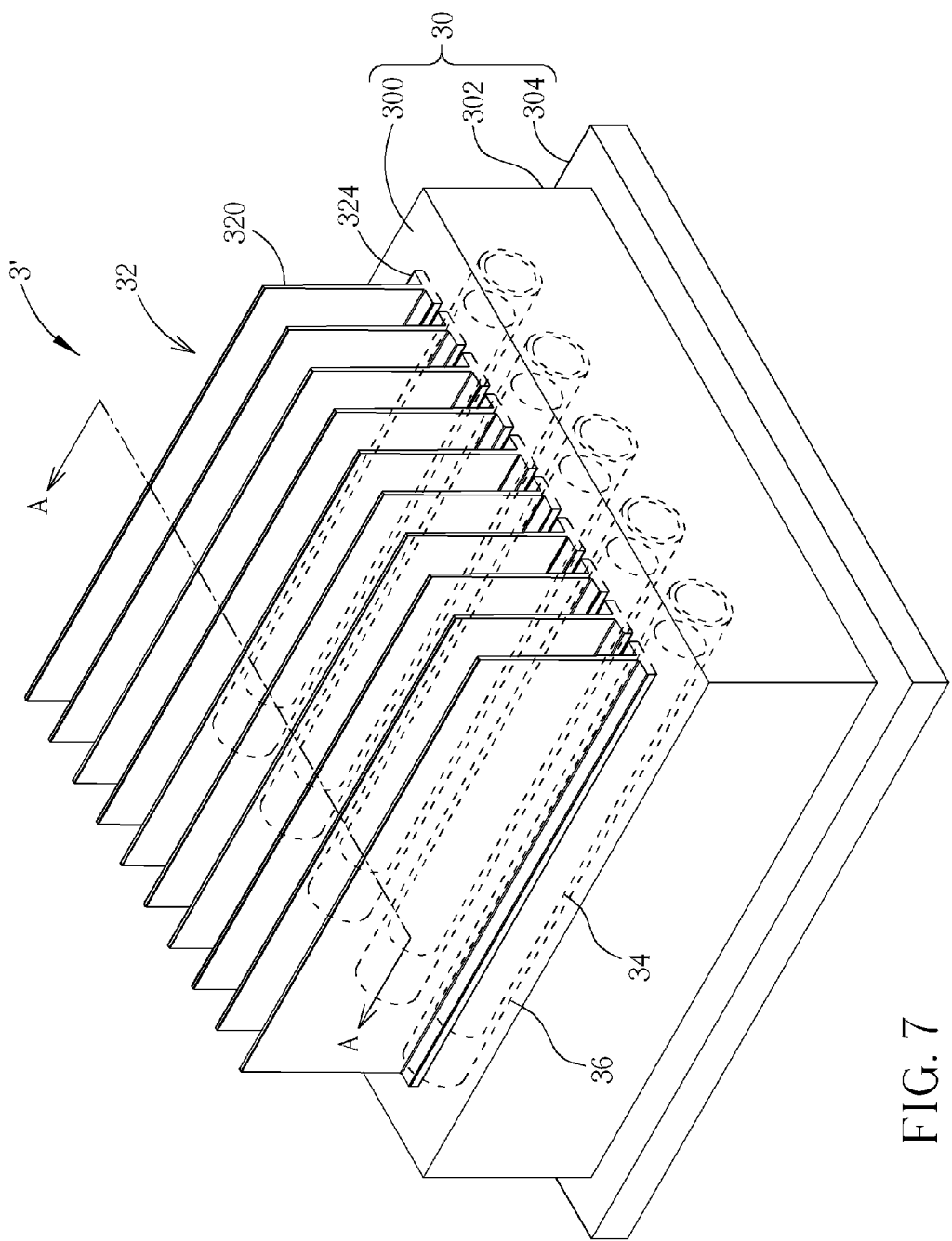
FIG. 7 is a cross-sectional view illustrating a heat dissipating device according to a second embodiment of the invention.

Referring to FIG. 7 along with FIG. 3, FIG. 7 is a cross-sectional view illustrating a heat dissipating device 3' according to a second embodiment of the invention. The difference between the heat dissipating device 3' and the aforesaid heat dissipating device 3 is that the heat dissipating device 3' further comprises a plurality of heat pipes 34 disposed in the substrate 300 of the base 30 so as to enhance heat dissipating efficiency. It should be noted that if the base 30 is formed by aluminum die casting process, each of the heat pipes 34 may be disposed in an aluminum sleeve 36 and then the heat pipe 34 and the aluminum sleeve 36 are put into a mold with the heat dissipating fins 32 for die casting process. Accordingly, the combination strength between the heat pipes 34 and the base 30 can be improved. Furthermore, the same elements in FIG. 7 and FIG. 3 are represented by the same numerals, so the repeated explanation will not be depicted herein again.

Figure 8:
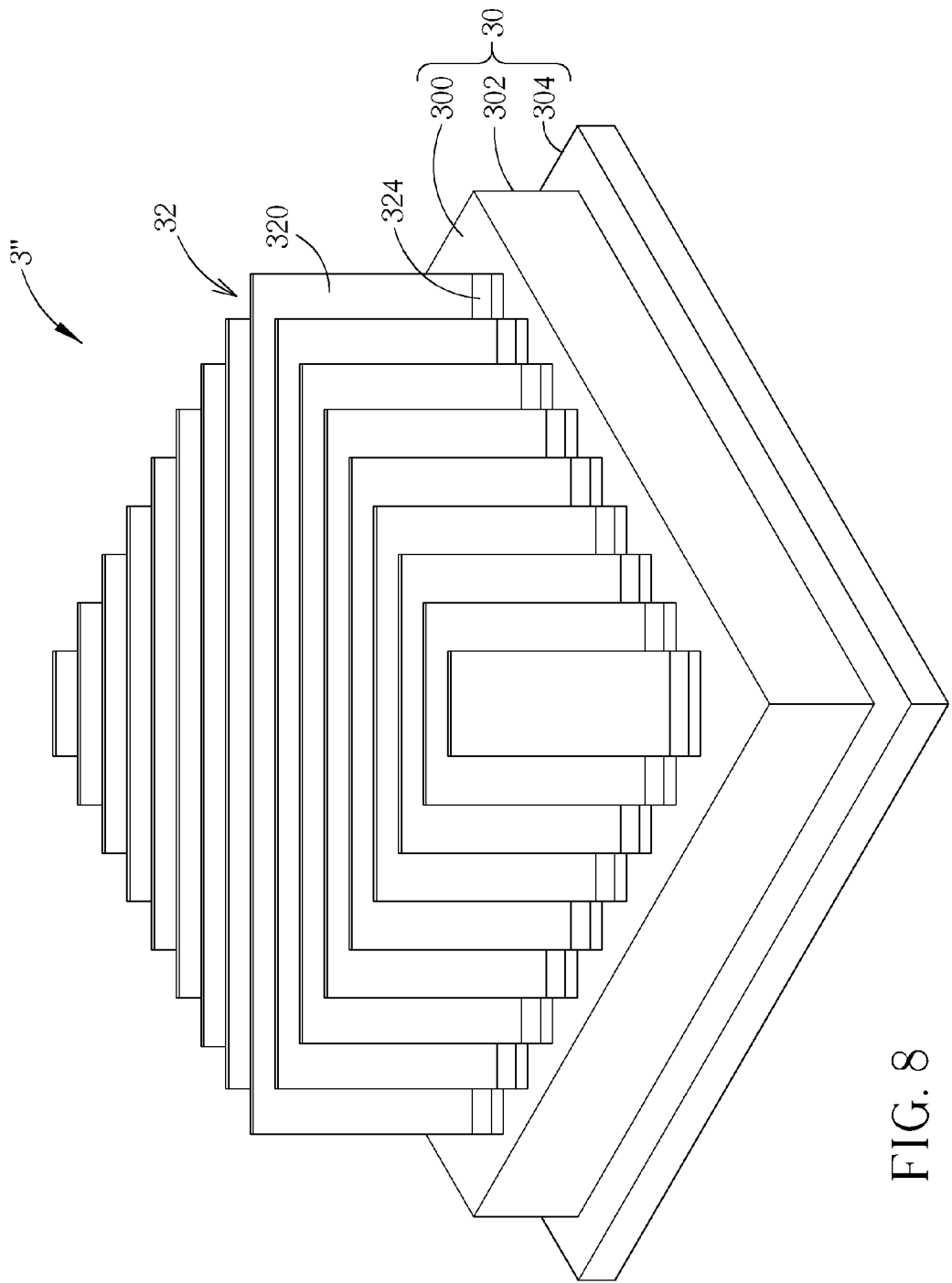
FIG. 8 is a cross-sectional view illustrating a heat dissipating device according to a third embodiment of the invention.

Referring to FIG. 8 along with FIG. 3, FIG. 8 is a cross-sectional view illustrating a heat dissipating device 3" according to a third embodiment of the invention. The difference between the heat dissipating device 3" and the aforesaid heat dissipating device 3 is the angles of the heat dissipating fins 32 with respect to the base 30. In other words, the angles of the heat dissipating fins 32 with respect to the base 30 can be determined based on practical applications. Fur further description, the heat dissipating fins 32 of the heat dissipating device 3 are substantially perpendicular to one edge of the substrate 300 and parallel to another edge of the substrate 300. Moreover, the heat dissipating fins 32 of the heat dissipating device 3" are substantially oblique to any edges of the substrate 300.

Figure 9:
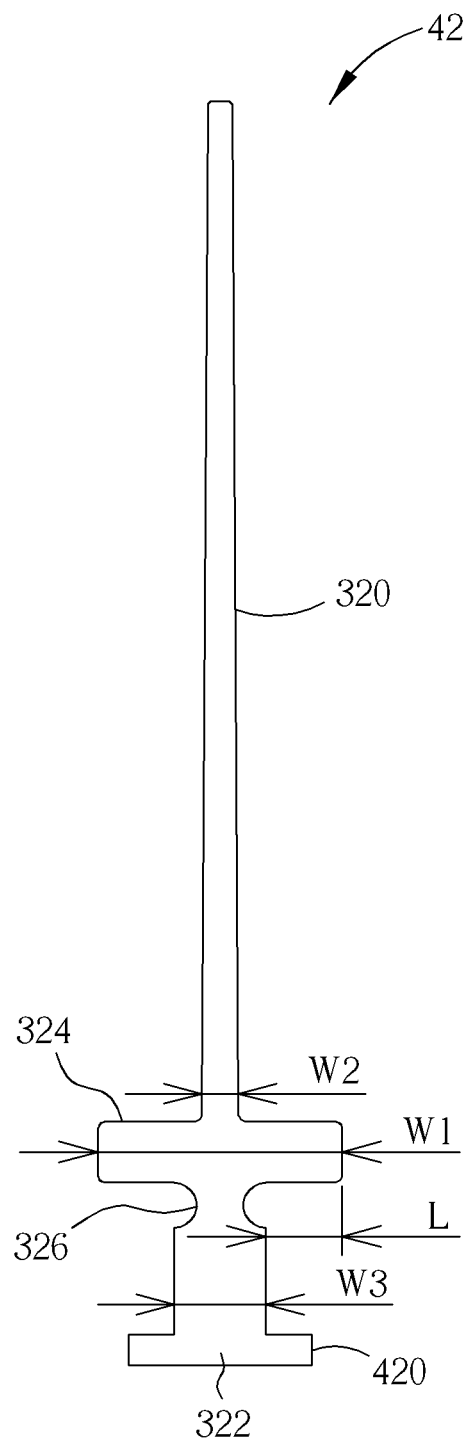
FIG. 9 is a cross-sectional view illustrating a heat dissipating fin according to a second embodiment of the invention.

Referring to FIG. 9 along with FIG. 4, FIG. 9 is a cross-sectional view illustrating a heat dissipating fin 42 according to a second embodiment of the invention. The difference between the heat dissipating fin 42 and the aforesaid heat dissipating fin 32 is that the heat dissipating fin 42 further comprises a protruding structure 420. As shown in FIG. 9, the protruding structure 420 protrudes from one end of the fixing portion 322. When the heat dissipating fin 32 shown in FIG. 4 is replaced by the heat dissipating fin 42 shown in FIG. 9, the protruding structure 420 of the heat dissipating fin 42 can cooperate with the overflow-proof structure 324 to hold the metal material so as to enhance the combination strength between the base 30 and the heat dissipating fin 42. It should be noted that the same elements in FIG. 9 and FIG. 4 are represented by the same numerals, so the repeated explanation will not be depicted herein again. Moreover, the heat dissipating fin 42 can be also formed by the forming process of the aforesaid step S100.

Figure 10:
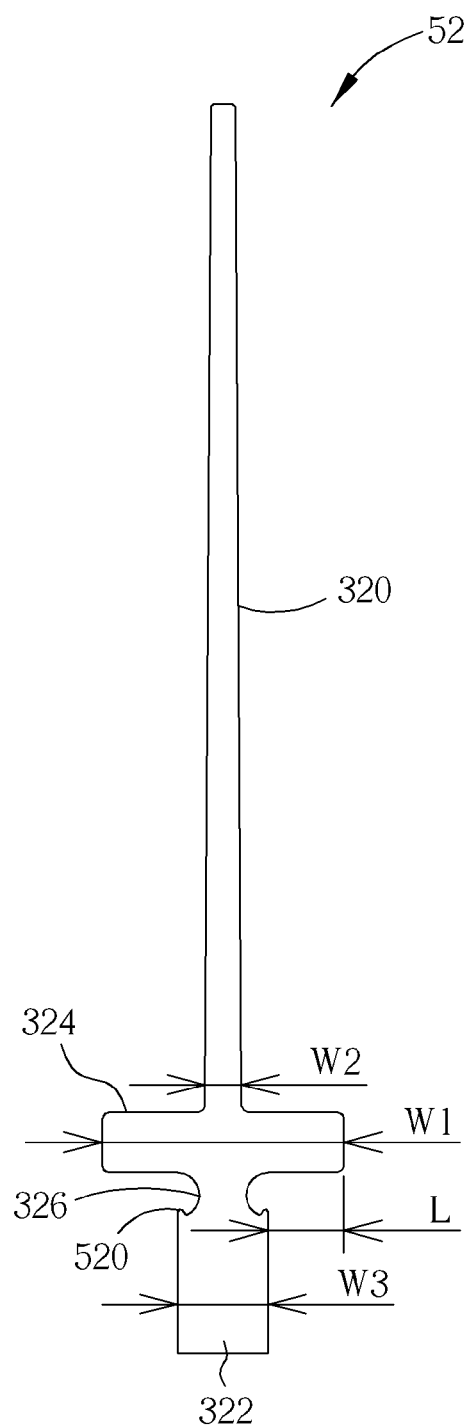
FIG. 10 is a cross-sectional view illustrating a heat dissipating fin according to a third embodiment of the invention.

Referring to FIG. 10 along with FIG. 4, FIG. 10 is a cross-sectional view illustrating a heat dissipating fin 52 according to a third embodiment of the invention. The difference between the heat dissipating fin 52 and the aforesaid heat dissipating fin 32 is that the heat dissipating fin 52 further comprises a hook structure 520. As shown in FIG. 10, the hook structure 520 is formed in the recess structure 326. When the heat dissipating fin 32 shown in FIG. 4 is replaced by the heat dissipating fin 52 shown in FIG. 10, the hook structure 520 of the heat dissipating fin 52 can hook the metal material so as to enhance the combination strength between the base 30 and the heat dissipating fin 52. It should be noted that the same elements in FIG. 10 and FIG. 4 are represented by the same numerals, so the repeated explanation will not be depicted herein again. Moreover, the heat dissipating fin 52 can be also formed by the forming process of the aforesaid step S100.

Figure 11:
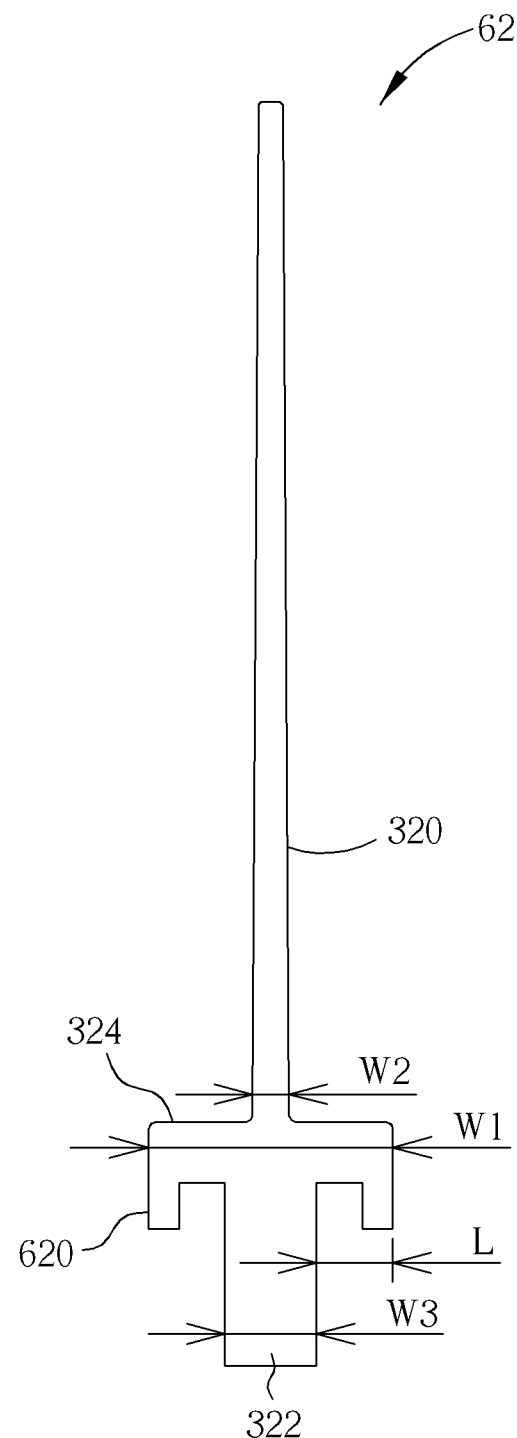
FIG. 11 is a cross-sectional view illustrating a heat dissipating fin according to a fourth embodiment of the invention.

Referring to FIG. 11 along with FIG. 4, FIG. 11 is a cross-sectional view illustrating a heat dissipating fin 62 according to a fourth embodiment of the invention. The difference between the heat dissipating fin 62 and the aforesaid heat dissipating fin 32 is that the heat dissipating fin 62 further comprises an extending structure 620 and does not comprise the aforesaid recess structure 326. As shown in FIG. 11, the extending structure 620 is extended from the overflow-proof structure 324 toward the fixing portion 322, and the overflow-proof structure 324 and the extending structure 620 are formed as U-shape. When the heat dissipating fin 32 shown in FIG. 4 is replaced by the heat dissipating fin 62 shown in FIG. 11, the extending structure 620 of the heat dissipating fin 62 can cooperate with the overflow-proof structure 324 to hold the metal material so as to enhance the combination strength between the base 30 and the heat dissipating fin 62. It should be noted that the same elements in FIG. 11 and FIG. 4 are represented by the same numerals, so the repeated explanation will not be depicted herein again. Moreover, the heat dissipating fin 62 can be also formed by the forming process of the aforesaid step S100.

Figure 12:
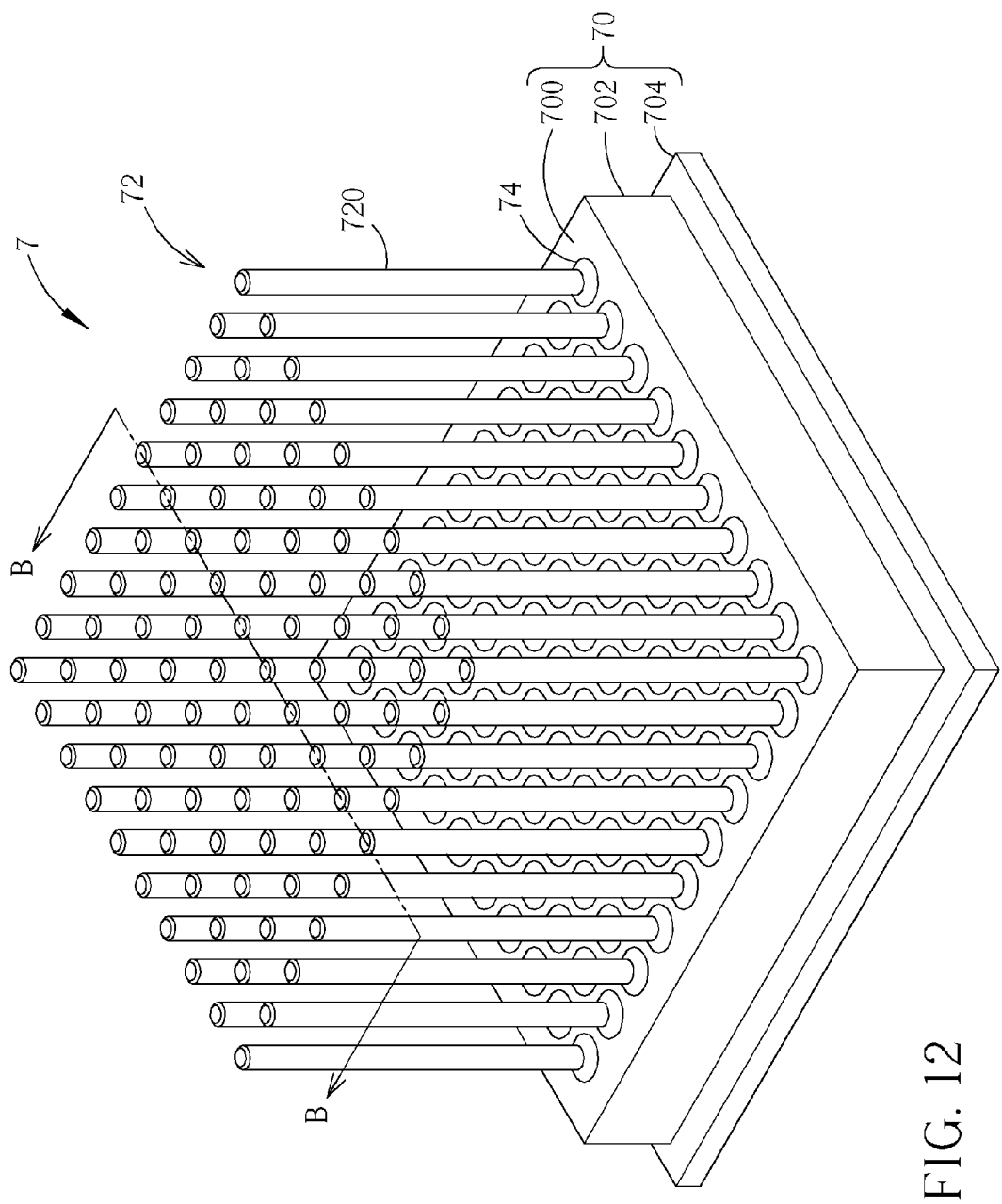
FIG. 12 is a schematic diagram illustrating a heat dissipating device according to a seventh embodiment of the invention.
Figure 13:
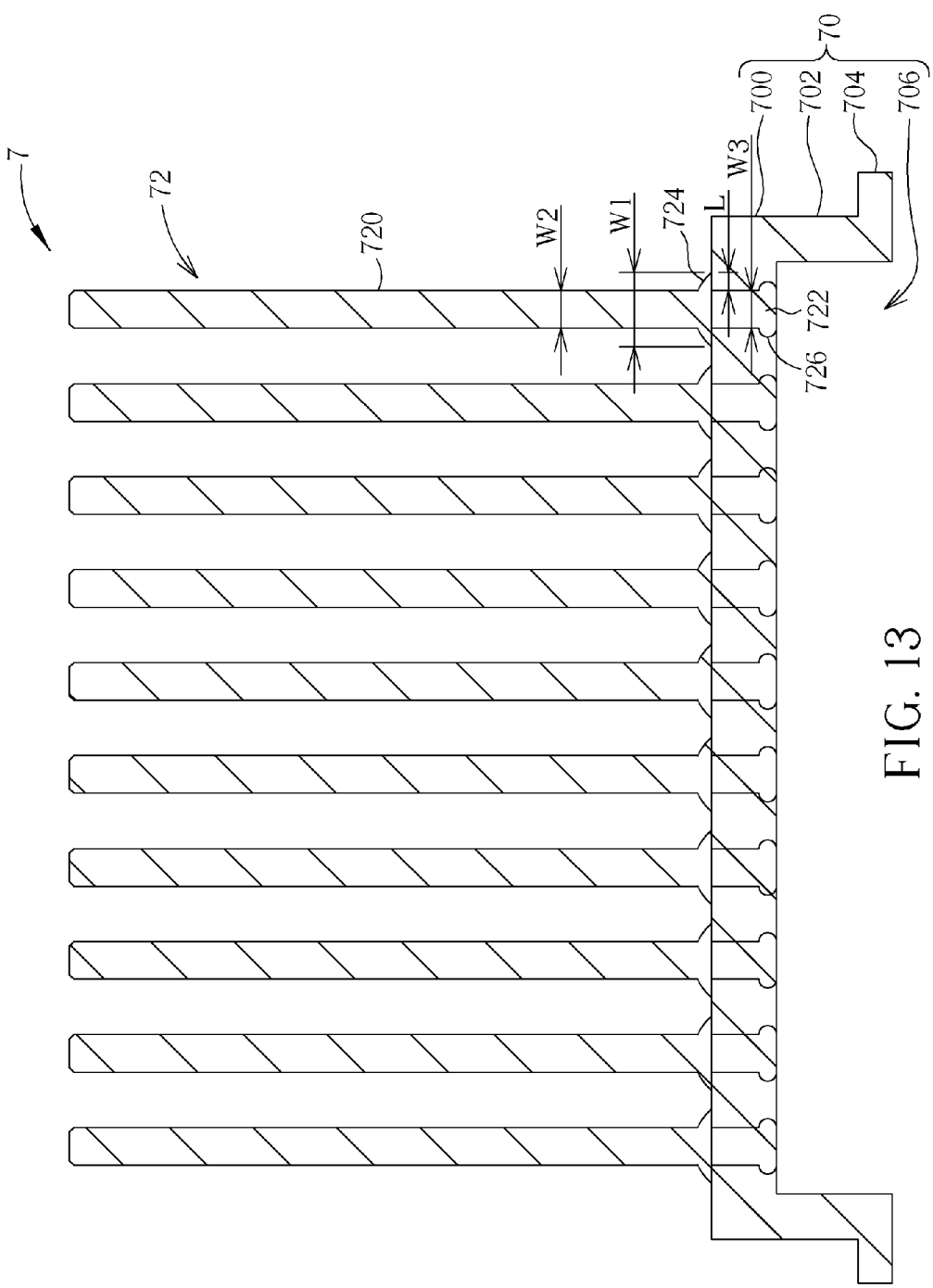
FIG. 13 is a cross-sectional view illustrating the heat dissipating device along line B-B shown in FIG. 12.
Figure 14:
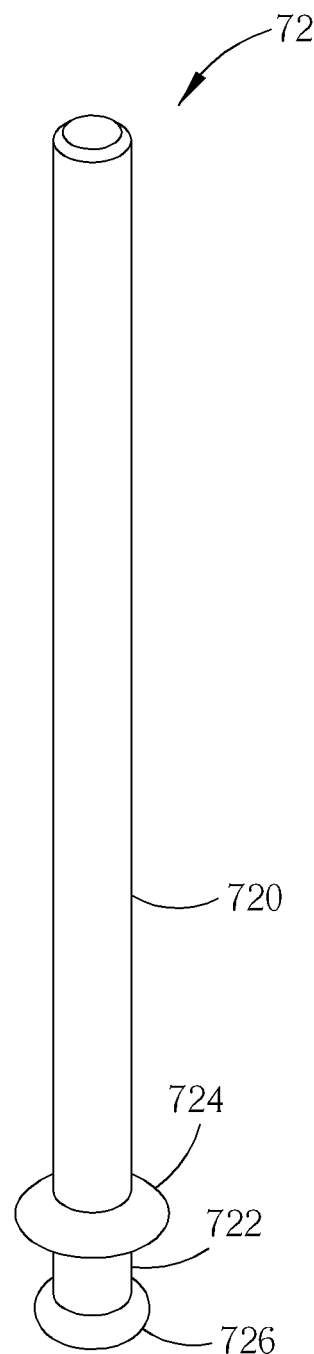
FIG. 14 is a schematic diagram illustrating the heat dissipating fin shown in FIG. 12.

Referring to FIGS. 12 to 14, FIG. 12 is a schematic diagram illustrating a heat dissipating device 7 according to a seventh embodiment of the invention, FIG. 13 is a cross-sectional view illustrating the heat dissipating device 7 along line B-B shown in FIG. 12, and FIG. 14 is a schematic diagram illustrating the heat dissipating fin 72 shown in FIG. 12. As shown in FIGS. 12 and 13, the heat dissipating device 7 comprises a base 70 and a plurality of heat dissipating fins 72. The base 70 comprises a substrate 700, a box 702 and a flange 704, wherein the substrate 700 and the box 702 are formed integrally, the box 702 has an accommodating space 706 therein, and the flange 704 protrudes from a periphery of the box 702. In practical applications, the flange 704 may be fixed on a plane by screw, rivet, soldering or other fixing manners so as to fix the heat dissipating device 7 on the plane. When the heat dissipating device 7 of the invention is installed outside (e.g. outdoor base station), electronic device(s) can be accommodated in the accommodating space 706 within the box 702 of the base 70 so as to protect the electronic device(s) from being battered and damaged by wind and rain.

As shown in FIGS. 13 and 14, each of the heat dissipating fins 72 comprises a heat dissipating portion 720, a fixing portion 722, an overflow-proof structure 724 and a protruding structure 726. The fixing portion 722 and the protruding structure 726 are fixed in the base 70. The overflow-proof structure 724 is connected between the heat dissipating portion 720 and the fixing portion 722. A width W1 of the overflow-proof structure 724 is larger than a width W2 of the heat dissipating portion 720 and larger than a width W3 of the fixing portion 722. In this embodiment, a length L of the overflow-proof structure 724 protruded from the fixing portion 722 can be between 1 mm and 10 mm. The protruding structure 726 protrudes from one end of the fixing portion 722. In this embodiment, a thickness of the overflow-proof structure 724 varies gradiently. In another embodiment, a thickness of the overflow-proof structure 724 may be uniform.

Figure 15:
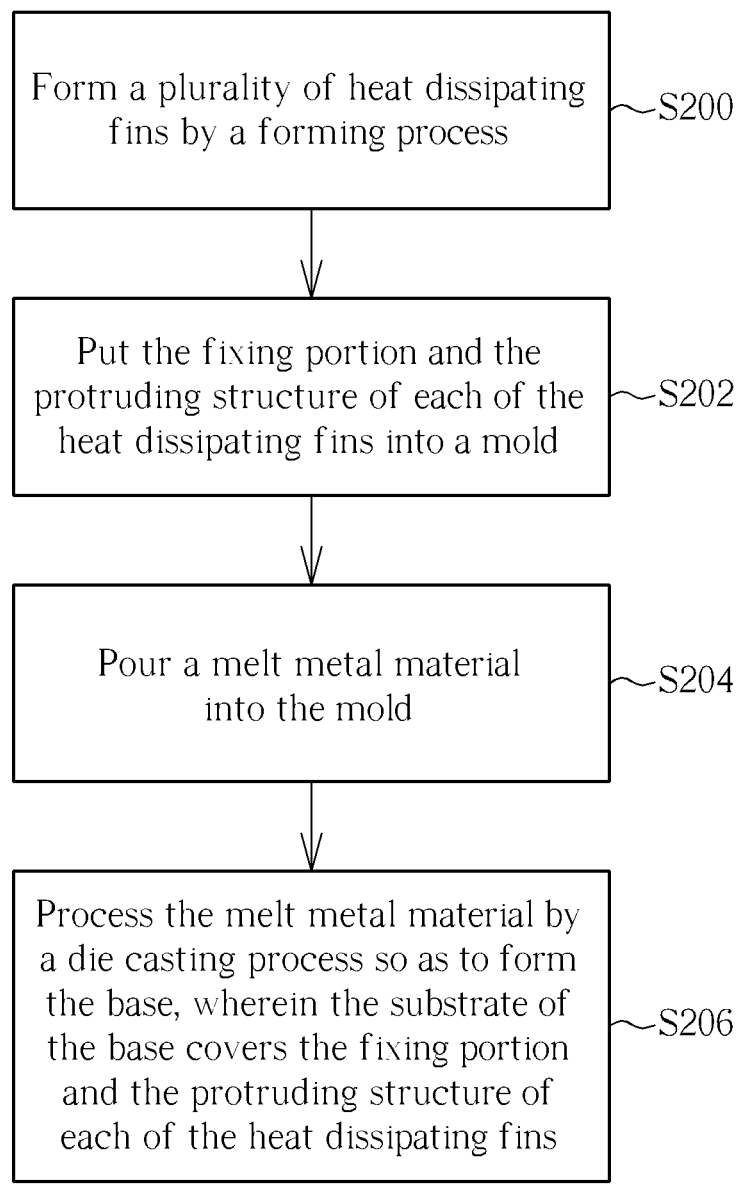
FIG. 15 is a flowchart illustrating a method of manufacturing the heat dissipating device shown in FIG. 12.

Referring to FIG. 15, FIG. 15 is a flowchart illustrating a method of manufacturing the heat dissipating device 7 shown in FIG. 12. First of all, step S200 is performed to form a plurality of heat dissipating fins 72 by a forming process. In this embodiment, the aforesaid forming process may be a rivet forming process so as to form each of the heat dissipating fins 72 as a cylinder-type heat dissipating fin. Afterward, step S202 is performed to put the fixing portion 722 and the protruding structure 726 of each of the heat dissipating fins 72 into a mold (not shown). Step S204 is then performed to pour a melt metal material (e.g. aluminum, etc.) into the mold. Finally, step S206 is performed to process the melt metal material by a die casting process so as to form the base 70, wherein the substrate 700 of the base 70 covers the fixing portion 722 and the protruding structure 726 of each of the heat dissipating fins 72, as shown in FIG. 11. In this embodiment, the overflow-proof structure 724 of each of the heat dissipating fins 72 is capable of preventing the melt metal material from overflowing during the die casting process so as to prevent deckle edge from being generated. When the length L of the overflow-proof structure 724 protruded from the fixing portion 722 is between 1 mm and 10 mm, the overflow-proof structure 724 can prevent the melt metal material from overflowing during the die casting process effectively so as to prevent deckle edge from being generated. Furthermore, the protruding structure 726 of each of the heat dissipating fins 72 can cooperate with the overflow-proof structure 724 to hold the metal material so as to enhance the combination strength between the base 70 and the heat dissipating fins 72.

Referring to FIG. 12 again, the heat pipes 34 shown in FIG. 7 can be also disposed in the substrate 700 of the base 70 so as to enhance heat dissipating efficiency. It should be noted that if the base 70 is formed by aluminum die casting process, each of the heat pipes 34 may be disposed in an aluminum sleeve 36 (as shown in FIG. 7) and then the heat pipe 34 and the aluminum sleeve 36 are put into a mold with the heat dissipating fins 72 for die casting process.

Figure 16:
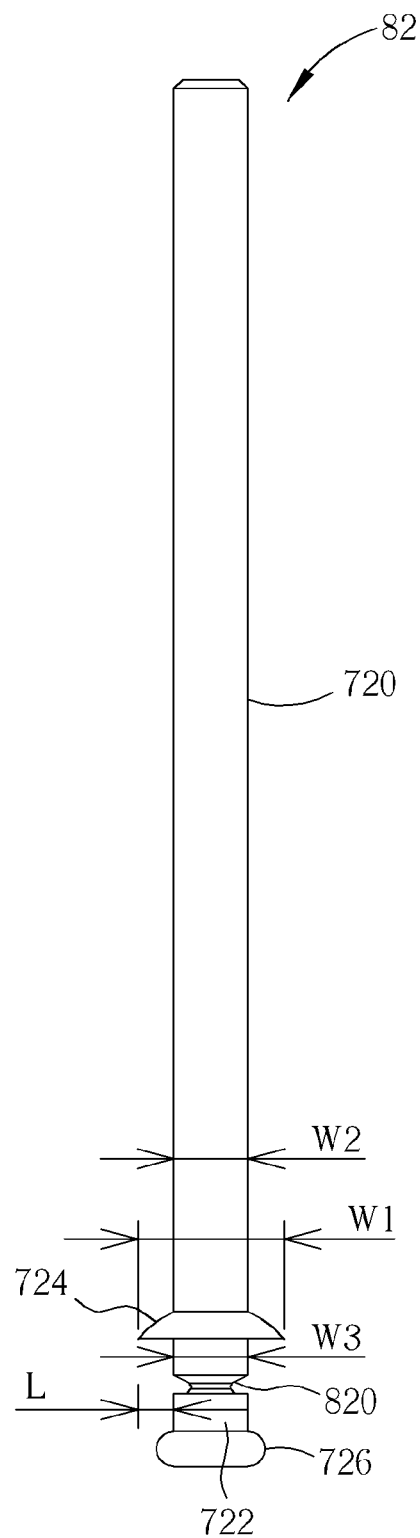
FIG. 16 is a cross-sectional view illustrating a heat dissipating fin according to an eighth embodiment of the invention.

Referring to FIG. 16 along with FIG. 13, FIG. 16 is a cross-sectional view illustrating a heat dissipating fin 82 according to an eighth embodiment of the invention. The difference between the heat dissipating fin 82 and the aforesaid heat dissipating fin 72 is that the heat dissipating fin 82 further comprises a recess structure 820. As shown in FIG. 16, the recess structure 820 is formed on the fixing portion 722. When the heat dissipating fin 72 shown in FIG. 13 is replaced by the heat dissipating fin 82 shown in FIG. 16, the recess structure 820 of the heat dissipating fin 82 can hold the metal material effectively so as to enhance the combination strength between the base 70 and the heat dissipating fin 82. It should be noted that the same elements in FIG. 16 and FIG. 13 are represented by the same numerals, so the repeated explanation will not be depicted herein again. Moreover, the heat dissipating fin 82 can be also formed by the forming process of the aforesaid step S200.

As mentioned in the above, when the heat dissipating device of the invention is installed outside, electronic device(s) can be accommodated in the accommodating space within the box of the base so as to protect the electronic device(s) from being battered and damaged by wind and rain. Furthermore, the invention may form the heat dissipating fin by a forming process (e.g. aluminum extrusion process, rivet forming process, etc.) first and then form the base, which covers the fixing portion of the heat dissipating fin, by a die casting process with melt metal material. The heat dissipating fin of the invention has the overflow-proof structure capable of preventing the melt metal material from overflowing during the die casting process so as to prevent deckle edge from being generated. Since the heat dissipating fin of the invention is formed by the forming process, the draft angle of the conventional heat dissipating fin is unnecessary for the heat dissipating fin of the invention. Therefore, the whole weight of the heat dissipating fin of the invention can be lighter and the height of the heat dissipating fin of the invention can be higher than the prior art. Furthermore, the number of heat dissipating fins of the invention can be increased in the heat dissipating device so that the heat dissipating area can be increased and the heat dissipating efficiency can be enhanced. Moreover, the invention may form the recess structure, the protruding structure, the hook structure and/or the extending structure on the heat dissipating fin so as to enhance the combination strength between the base and the heat dissipating fin.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating device comprising:

a base comprising a substrate and a box, the substrate and the box being formed integrally, the box having an accommodating space therein; and a plurality of heat dissipating fins, each of the heat dissipating fins comprising:

a heat dissipating portion;

a fixing portion fixed in the base such that a bottom surface of the fixing portion is flush with a bottom surface of the substrate; and Where each fin has an overflow-proof structure that includes first and second portions extending traversely with respect to each fin, where the overflow-proof structures of each of the plurality of fins are spaced apart from each other;

and where the overflow-proof structure is connected between the heat dissipating portion and the fixing portion, wherein the overflow-proof structure is above and directly coupled to the substrate, extends outwards away from where the overflow-proof structure connects with the fixing portion, and the overflow-proof structure is separated from an overflow-proof structure of each of other heat dissipating fins.

* * * * *